(12) United States Patent
Shin et al.

(10) Patent No.: US 9,735,754 B2
(45) Date of Patent: Aug. 15, 2017

(54) BULK ACOUSTIC WAVE RESONATOR HAVING A PLURALITY OF COMPENSATION LAYERS AND DUPLEXER USING SAME

(75) Inventors: Jea Shik Shin, Hwaseong-si (KR); In Sang Song, Osan-si (KR); Young Il Kim, Suwon-si (KR); Duck Hwan Kim, Goyang-si (KR); Chul Soo Kim, Hwaseong-si (KR); Sang Uk Son, Yongin-si (KR); Hyung Rak Kim, Seoul (KR); Jae Chun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 434 days.

(21) Appl. No.: 13/558,907

(22) Filed: Jul. 26, 2012

(65) Prior Publication Data
US 2013/0027153 A1 Jan. 31, 2013

(30) Foreign Application Priority Data
Jul. 27, 2011 (KR) ........................ 10-2011-0074616

(51) Int. Cl.
*H03H 9/15* (2006.01)
*H03H 9/54* (2006.01)
(Continued)

(52) U.S. Cl.
CPC ........ *H03H 9/02102* (2013.01); *H03H 9/171* (2013.01); *H03H 9/173* (2013.01);
(Continued)

(58) Field of Classification Search
CPC .... H03H 9/02102; H03H 9/173; H03H 9/174; H03H 9/587; H03H 9/588; H03H 9/605; H03H 9/706
(Continued)

(56) References Cited

U.S. PATENT DOCUMENTS 4,456,850 A 6/1984 Inoue et al.
6,131,256 A 10/2000 Dydyk et al.
(Continued)

FOREIGN PATENT DOCUMENTS

JP 1-157108 * 6/1989
JP 2005-051447 A 2/2005
(Continued)

OTHER PUBLICATIONS

International Search Report mailed Nov. 23, 2012, issued in counterpart International Patent Application No. PCT/KR2012/005847; 3 pages in English language.
(Continued)

*Primary Examiner* — Barbara Summons
(74) *Attorney, Agent, or Firm* — NSIP Law

(57) ABSTRACT

A bulk acoustic wave resonator (BAWR) includes a bulk acoustic resonance unit and at least one compensation layer. The bulk acoustic resonance unit includes a first electrode, a second electrode, and a piezoelectric layer disposed between the first electrode and the second electrode. The first electrode, the second electrode, and the piezoelectric layer each include a material that modifies a resonance frequency based on a temperature, and the at least one compensation layer includes a material that adjusts the resonance frequency modified based on the temperature in a direction opposite to a direction of the modification.

30 Claims, 10 Drawing Sheets

(51) Int. Cl.
  *H03H 9/70* (2006.01)
  *H03H 9/02* (2006.01)
  *H03H 9/58* (2006.01)
  *H03H 9/17* (2006.01)

(52) U.S. Cl.
  CPC ............ *H03H 9/174* (2013.01); *H03H 9/588* (2013.01); *H03H 9/706* (2013.01)

(58) Field of Classification Search
  USPC .......................... 333/133, 187–192; 310/346
  See application file for complete search history.

(56) References Cited

U.S. PATENT DOCUMENTS

| | | | |
|---|---|---|---|
| 6,670,866 B2 | 12/2003 | Ellä et al. | |
| 6,842,088 B2* | 1/2005 | Yamada | B06B 1/0644 310/322 |
| 6,989,723 B2 | 1/2006 | Komuro et al. | |
| 7,106,148 B2* | 9/2006 | Kawamura | 333/133 |
| 7,280,007 B2* | 10/2007 | Feng | H03H 9/02118 333/187 |
| 7,388,454 B2* | 6/2008 | Ruby | H03H 3/02 310/322 |
| 7,408,428 B2 | 8/2008 | Larson, III | |
| 2002/0038989 A1 | 4/2002 | Larson, III | |
| 2003/0006862 A1* | 1/2003 | Takeuchi et al. | 333/187 |
| 2005/0023932 A1* | 2/2005 | Inoue et al. | 310/327 |
| 2005/0110598 A1* | 5/2005 | Larson, III | 333/191 |
| 2006/0279175 A1* | 12/2006 | Aigner | 310/346 |
| 2007/0120625 A1* | 5/2007 | Larson et al. | 333/189 |
| 2007/0222336 A1* | 9/2007 | Grannen et al. | 310/320 |
| 2008/0012450 A1* | 1/2008 | Meister et al. | 310/313 R |
| 2008/0079516 A1* | 4/2008 | Ruby et al. | 333/189 |
| 2008/0116999 A1* | 5/2008 | Park et al. | 333/187 |
| 2010/0182102 A1 | 7/2010 | Kuypers et al. | |
| 2010/0327701 A1* | 12/2010 | Grannen et al. | 310/346 |

FOREIGN PATENT DOCUMENTS

| | | |
|---|---|---|
| JP | 2006-295380 A | 10/2006 |
| JP | 2008-79227 A | 4/2008 |
| KR | 10-2005-0066104 A | 6/2005 |

OTHER PUBLICATIONS

K.M. Lakin, et al., "Temperature Compensated Bulk Acoustic Thin Film Resonators," IEEE Ultrasonics Symposium, vol. 1, Oct. 2000, San Juan, pp. 855-858.

D. Petit, et al., "Temperature Compensated Bulk Acoustic Wave Resonator and its Predictive 1D Acoustic Tool for RF Filtering," IEEE Ultrasonics Symposium, Oct. 28-31, 2007, in New York, NY, pp. 1243-1246.

Extended European Search Report issued on Feb. 27, 2015 in counterpart European Application No. 12817208.7 (13 pages, in English).

* cited by examiner

BULK ACOUSTIC WAVE RESONATOR HAVING A PLURALITY OF COMPENSATION LAYERS AND DUPLEXER USING SAME

CROSS-REFERENCE TO RELATED APPLICATIONS

This application claims the benefit of Korean Patent Application No. 10-2011-0074616 filed on Jul. 27, 2011, in the Korean Intellectual Property Office, the entire disclosure of which is incorporated herein by reference for all purposes.

BACKGROUND

1. Field

The following description relates to a bulk acoustic wave resonator (BAWR).

2. Description of Related Art

A mobile communication terminal transmits and receives a communication signal. The signal transmission is performed using a transmission frequency, and the signal reception is performed using a reception frequency. To prevent interference between a transmitted signal and a received signal, a predetermined band gap is required between the transmission frequency and the reception frequency. However, frequency resources are limited, and the band gap reduces the available frequency resources because it cannot be used for communication. Therefore the band gap needs to be reduced to increase the frequency resources that are available for communication.

SUMMARY

According to an aspect, a bulk acoustic wave resonator (BAWR) includes a bulk acoustic resonance unit including a first electrode; a second electrode; and a piezoelectric layer disposed between the first electrode and the second electrode; each of the first electrode, the second electrode, and the piezoelectric layer including a material that modifies a resonance frequency based on a temperature; the BAWR further including at least one compensation layer including a material that adjusts the resonance frequency modified based on the temperature in a direction opposite to a direction of the modification.

The at least one compensation layer may adjust a temperature coefficient of the bulk acoustic wave resonance unit, and may include a compensation layer disposed between the first electrode or the piezoelectric layer, or between the piezoelectric layer and the second electrode, or may include a first compensation layer and a second compensation layer disposed so that the first compensation layer is between the first electrode and the piezoelectric layer, and the second compensation layer is between the piezoelectric layer and the second electrode.

The at least one compensation layer may adjust a temperature coefficient of the bulk acoustic wave resonance unit, and may include a compensation layer disposed so that the first electrode is between the compensation layer and the piezoelectric layer, or so that the compensation layer is between the first electrode and the piezoelectric layer, or may include a first compensation layer and a second compensation layer disposed so that the first electrode is between the first compensation layer and the second compensation layer, and the second compensation layer is between the first electrode and the piezoelectric layer.

The at least one compensation layer may adjust a temperature coefficient of the bulk acoustic wave resonance unit, and may include a compensation layer disposed so that the compensation layer is between the piezoelectric layer and the second electrode, or so that the second electrode is between the piezoelectric layer and the compensation layer, or may include a first compensation layer and a second compensation layer disposed so that the first compensation layer is between the piezoelectric layer and the second electrode, and the second electrode is between the first compensation layer and the second compensation layer.

The at least one compensation layer may include a first compensation layer disposed so that the first electrode is between the first compensation layer and the piezoelectric layer; and a second compensation layer disposed so that the second electrode is between the piezoelectric layer and the second compensation layer.

A sum of a thickness of each compensation layer of the at least one compensation layer may be less than or equal to a sum of a thickness of the first electrode, a thickness of the piezoelectric layer, and a thickness of the second electrode.

A sum of a thickness of each compensation layer of the at least one compensation layer may be less than or equal to 2 micrometers (μm).

The at least one compensation layer may include a silicon oxide-based material or a silicon nitride-based material.

The at least one compensation layer may include silicon oxide doped with any impurity, or silicon nitride doped with an impurity.

The impurity may include at least one element selected from the group consisting of arsenic (As), antimony (Sb), phosphorus (P), boron (B), germanium (Ge), silicon (Si), and aluminum (Al).

The BAWR may further include a membrane contacting the bulk acoustic resonance unit; wherein the at least one compensation layer may include a compensation layer that is a portion of the membrane that has been doped with an impurity.

The at least one compensation layer may include a compensation layer disposed so that the first electrode is between the compensation layer and the piezoelectric layer; and the BAWR may further include a property compensation layer disposed on the compensation layer so that the compensation layer is between the property compensation layer and the first electrode; and the property compensation layer may be disposed on edges of a surface of the compensation layer so that a remaining portion of the surface between the edges is not covered by the property compensation layer.

The at least one compensation layer may include a first compensation layer contacting the first electrode so that the first electrode is between the first compensation layer and the piezoelectric layer; and a second compensation layer contacting the first compensation layer so that the first compensation layer is between the second compensation layer and the first electrode.

The at least one compensation layer may include a first compensation layer contacting the first electrode so that the first electrode is between the first compensation layer and the piezoelectric layer; a second compensation layer contacting the second electrode so that the second electrode is between the piezoelectric layer and the second compensation layer; and a third compensation layer contacting the second compensation layer so that the second compensation layer is between the second electrode and the third compensation layer.

According to an aspect, a bulk acoustic wave resonator (BAWR) includes a substrate; an air cavity disposed on a portion of the substrate; a bulk acoustic wave resonance unit including a first electrode disposed so that the air cavity is between a portion of the first electrode and the portion of the substrate; a second electrode disposed so that a portion of the second electrode is between the portion of the first electrode and the air cavity; and a piezoelectric layer disposed so that a portion of the piezoelectric layer is between the portion of the first electrode and the portion of the second electrode; the BAWR further including a compensation layer disposed so that a portion of the compensation layer is between the portion of the second electrode and the air cavity, or so that the portion of the first electrode is between a portion of the compensation layer and the portion of the piezoelectric layer; wherein the compensation layer includes a material that adjusts a resonance frequency that is modified in the bulk acoustic wave resonance unit based on a temperature in a direction opposite to a direction of the modification.

The compensation layer may be a first compensation layer disposed so that a portion of the first compensation layer is between the portion of the second electrode and the air cavity; the BAWR may further include a second compensation layer disposed so that the portion of the first electrode is between a portion of the second compensation layer and the portion of the piezoelectric layer; and the second compensation layer may include a material that adjusts the modified resonance frequency in the direction opposite to the direction of the modification.

The BAWR may further include a third compensation layer disposed so that a portion of the third compensation layer is between the portion of the first compensation layer and the air cavity; wherein the third compensation layer may include a material that adjusts the modified resonance frequency in the direction opposite to the direction of the modification.

The BAWR may further include a fourth compensation layer disposed so that the portion of the second compensation layer is between a portion of the fourth compensation layer and the portion of the first electrode; wherein the fourth compensation layer may include a material that adjusts the modified resonance frequency in the direction opposite to the direction of the modification.

The BAWR may further include a third compensation layer disposed so that the portion of the second compensation layer is between a portion of the third compensation layer and the portion of the first electrode; wherein the third compensation layer may include a material that adjusts the modified resonance frequency in the direction opposite to the direction of the modification.

A sum of a thickness of the first compensation layer and a thickness of the second compensation layer may be less than or equal to a sum of a thickness of the first electrode, a thickness of the piezoelectric layer, and a thickness of the second electrode.

According to an aspect, a duplexer includes a first filter configured to filter a transmission signal received from a transmit input of the duplexer, and output the filtered transmission signal to an antenna; a phase shifter configured to shift a phase of a received signal received from the antenna, and output the phase-shifted received signal; and a second filter configured to filter the phase-shifted received signal output from the phase shifter, and output the filtered phase-shifted received signal to a receive output of the duplexer; wherein the first filter and the second filter operate at different predetermined resonance frequencies; the phase shifter is further configured to shift the phase of the received signal to prevent signal interference between the first filter and the second filter; and each of the first filter and the second filter includes a bulk acoustic source resonance unit including a first electrode; a second electrode; and a piezoelectric layer; each of the first electrode, the second electrode, and the piezoelectric layer including a material that modifies a resonance frequency based on a temperature; each of the first filter and the second filter further including at least one compensation layer including a material that adjusts the modified resonance frequency in a direction opposite to a direction of the modification.

According to an aspect, a bulk acoustic wave resonator (BAWR) includes a bulk acoustic wave resonance unit including a first electrode; a second electrode; and a piezoelectric layer disposed between the first electrode and the second electrode; each of the first electrode, the second electrode, and the piezoelectric layer including a material that modifies a resonance frequency based on a temperature; the BAWR further including at least one compensation layer to adjust the resonance frequency modified based on the temperature in a direction opposite to a direction of the modification; wherein a sum of a temperature coefficient of frequency (TCF) of the bulk acoustic wave resonance unit and a TCF of the at least one compensation layer is substantially zero.

The BAWR may further include a substrate; and an air cavity disposed on a portion of the substrate; wherein the second electrode may be disposed so that the air cavity is between a portion of the second electrode and the portion of the substrate; the piezoelectric layer may be disposed so that the portion of the second electrode is between a portion of the piezoelectric layer and the air cavity; the first electrode may be disposed so that the portion of the piezoelectric layer is between a portion of the first electrode and the portion of the second electrode; and the at least one compensation layer may include a compensation layer disposed so that a portion of the compensation layer is between the portion of the second electrode and the air cavity, or so that the portion of the first electrode is between a portion of the compensation layer and the portion of the piezoelectric layer.

A sum of a thickness of each compensation layer of the at least one compensation layer may be less than or equal to a sum of a thickness of the first electrode, a thickness of the piezoelectric layer, and a thickness of the second electrode.

According to an aspect, a bulk acoustic wave resonator (BAWR) includes a substrate including a surface, the surface including a first portion, a second portion, and a third portion, the second portion being between the first portion and the third portion; an air cavity disposed on the second portion of the surface of the substrate; a bulk acoustic wave resonance unit including a first electrode disposed so that a first portion of the first electrode opposes the first portion of the surface of the substrate, and the air cavity is between a second portion of the first electrode and the second portion of the surface of the substrate; a second electrode disposed so that a first portion of the second electrode opposes the third portion of the surface of the substrate, and a second portion of the second electrode is between the second portion of the first electrode and the air cavity; and a piezoelectric layer disposed so that a first portion of the piezoelectric layer is between the first portion of the first electrode and the first portion of the surface of the substrate, a second portion of the piezoelectric layer is between the second portion of the first electrode and the second portion of the second electrode, and the first portion of the second electrode is between a third portion of the piezoelectric layer and the third portion of the surface of the substrate; the BAWR further including at least one compensation layer including a material that adjusts a resonance frequency that is modified in the bulk acoustic wave resonance unit based on a temperature in a direction opposite to a direction of the modification.

According to an aspect, the at least one compensation layer may include any one or more of the following compensation layers: a compensation layer disposed so that a first portion of the compensation layer is between the first portion of the piezoelectric layer and the first portion of the surface of the substrate, a second portion of the compensation layer is between the second portion of the second electrode and the air cavity, and a third portion of the compensation layer is between the first portion of the second electrode and the third portion of the surface of the substrate; a compensation layer disposed so that a first portion of the compensation layer is between the first portion of the piezoelectric layer and the first portion of the surface of the substrate, a second portion of the compensation layer is disposed between the second portion of the second electrode and the second portion of the piezoelectric layer, and a third portion of the compensation layer is disposed between the third portion of the piezoelectric layer and the first portion of the second electrode; a compensation layer disposed so that a first portion of the compensation layer is between the first portion of the first electrode and the first portion of the piezoelectric layer, a second portion of the compensation layer is between the second portion of the first electrode and the second portion of the piezoelectric layer, and the third portion of the piezoelectric layer is between a third portion of the compensation layer and the first portion of the second electrode; and a compensation layer disposed so that the first portion of the first electrode is between a first portion of the compensation layer and the first portion of the piezoelectric layer, the second portion of the first electrode is between a second portion of the compensation layer and the second portion of the piezoelectric layer, and the third portion of the piezoelectric layer is between a third portion of the compensation layer and the first portion of the second electrode.

According to an aspect, the at least one compensation layer may include either one or both of the following pairs of compensation layers: a pair of compensation layers contacting one another and disposed so that a first portion of the pair of compensation layers is between the first portion of the piezoelectric layer and the first portion of the surface of the substrate, a second portion of the pair of compensation layers is between the second portion of the second electrode and the air cavity, and a third portion of the pair of compensation layers is between the first portion of the second electrode and the third portion of the surface of the substrate; and a pair of compensation layers contacting one another and disposed so that the first portion of the first electrode is between a first portion of the pair of compensation layers and the first portion of the piezoelectric layer, the second portion of the first electrode is between a second portion of the pair of compensation layers and the second portion of the piezoelectric layer, and the third portion of the piezoelectric layer is between a third portion of the pair of compensation layers and the first portion of the second electrode.

According to an aspect, a temperature coefficient of the BAWR may be adjusted by adding, on or below a piezoelectric layer, or on and below a piezoelectric layer, a compensation layer that adjusts a temperature coefficient of frequency (TCF). Therefore, a BAWR having a low TCF may be provided.

According to a aspect, a BAWR having a low TCF may be used in a filter and a duplexer to provide an appropriately narrow band gap between a transmission frequency and a reception frequency.

According to an aspect, a BAWR having a low TCF may be used in a filter to decrease a change in a frequency characteristic of the filter based on a change in a temperature.

According to an aspect, a BAWR having a low TCF may be used in a mobile communication terminal to provide reliable operation within a range of an ambient temperature at which the mobile communication terminal is used.

According to an aspect, a temperature coefficient of a BAWR may be adjusted by doping, with an impurity element, a portion of a membrane or a portion of a passivation layer of an upper portion electrode of the BAWR, and thus may provide degrees of freedom in product design without modification of a structure of the BAWR.

According to an aspect, a compensation layer may be provided in an BAWR to adjust a temperature coefficient of frequency (TCF) of the BAWR, and a portion of the compensation layer may be etched or an additional layer may be provided on a portion of the compensation adjust a quality factor (Q) value of the BAWR.

Other features and aspects will be apparent from the following detailed description, the drawings, and the claims.

DETAILED DESCRIPTION

Figure 1:
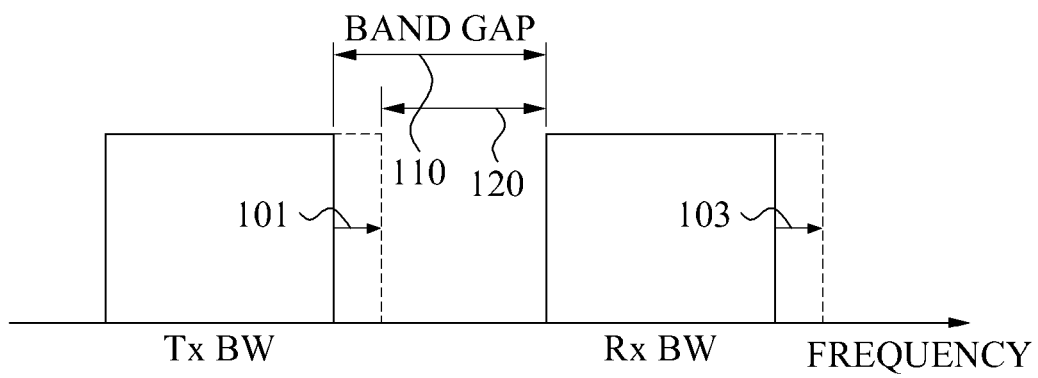
FIG. 1 illustrates a band gap between a transmission frequency and a reception frequency of a mobile communication terminal.

The following detailed description is provided to assist the reader in gaining a comprehensive understanding of the methods, apparatuses and/or systems described herein. Accordingly, various changes, modifications, and equivalents of the methods, apparatuses and/or systems described herein will be apparent to one of ordinary skill in the art. Any sequences of processing steps and/or operations described herein are merely examples, and the sequences of processing steps and/or operations is not limited to the specific examples set forth herein, and may be changed as will be apparent to one of ordinary skill in the art, with the exception of processing steps and/or operations necessarily occurring in a certain order. Also, descriptions of well-known functions and constructions may be omitted for increased clarity and conciseness.

Throughout the drawings and the detailed description, the same reference numerals refer to the same elements, features, and structures. The relative size and depiction of these elements may be exaggerated for clarity, illustration, and convenience.

In the following description and the claims, when a first element is described as being between a second element and the third element, one or more other elements may also be present between the first element and the second element, and/or between the first element and the third elements.

A bulk acoustic wave resonator (BAWR) operates through electrodes disposed on or below a piezoelectric layer, or on and below the piezoelectric layer. In response to a high frequency electric potential applied to the electrodes, the piezoelectric layer oscillates. Thus, the BAWR may operate as a filter. The BAWR may be elevated above a substrate to provide an air cavity to improve a reflection characteristic of an acoustic wave.

In a case of a BAWR having a frequency band-pass characteristic, a plurality of resonators may be disposed on a plane and connected to a common electrode to improve a reflection characteristic or a transmission characteristic within a frequency band range.

The BAWR may be used in a filter, a transmitter, a receiver, or a duplexer in a wireless communication device for input and output of wireless data. There are various types of wireless communication devices for various purposes, and a number of wireless devices conventionally regarded as wired devices has rapidly increased. Thus, a number of fields to which the BAWR may be applied has expanded.

The BAWR may be a device that induces an oscillation or waves of a predetermined frequency using resonance, and the device may be used as a component in a resonance frequency (RF) device, for example, a filter and an oscillator.

FIG. 1 illustrates a band gap between a transmission frequency and a reception frequency of a mobile communication terminal.

Frequency resources that mobile communication devices may use are limited. Therefore, each mobile communication device performs communication based on an allocated frequency band. To prevent interference from occurring between a transmitted signal and a received signal, a band gap is needed between a transmission frequency band for signal transmission and a reception frequency band for signal reception. Reducing a band gap between allocated frequency bands can provide a wider frequency band to increase an amount of data that can be transmitted and received. Thus, there is a need for an apparatus that is capable of performing communication using a narrow frequency band gap without interference occurring between a transmitted signal and a received signal.

Referring to FIG. 1, a transmission frequency band increases by a width 101 and a reception frequency band increases by a width 103 to meet the demands of communication companies. As the transmission frequency band increases by the width 101, a band gap 110 decreases to a band gap 120.

A duplexer may be implemented using a bulk acoustic wave resonator (BAWR) that separates a transmitted signal and a received signal. In this example, to accurately and effectively separate the transmitted signal and the received signal within the narrowed band gap 120, a BAWR having a high quality factor (Q) value and a low temperature coefficient of frequency (TCF) are required. The TCF of the BAWR is a ratio of a frequency variation of the BAWR within a range of a temperature at which the BAWR is used. The closer TCF is to zero, the lower a frequency variance based on a temperature will be.

According to an example, a BAWR having a low TCF is used for a duplexer that separates a transmitted signal and a received signal within a narrow band gap.

Figure 2:
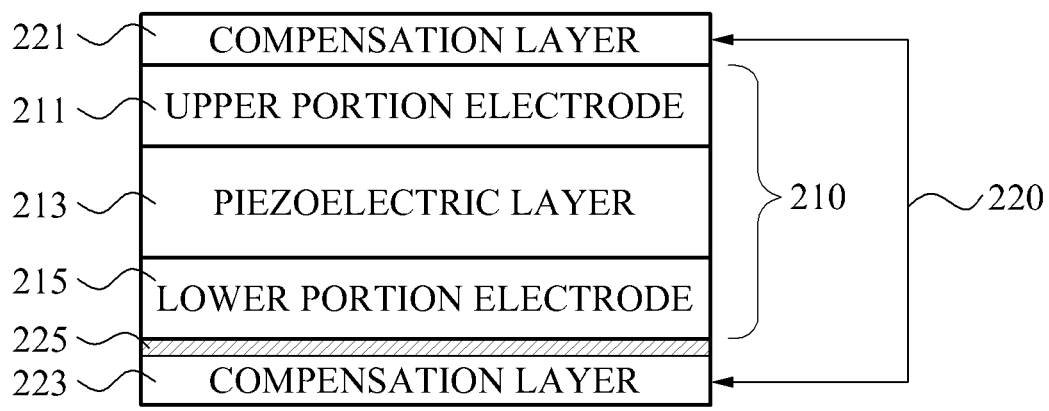
FIG. 2 illustrates an example of a bulk acoustic wave resonator (BAWR).

FIG. 2 illustrates an example of a BAWR.

Referring to FIG. 2, the BAWR includes a bulk acoustic wave resonance unit 210 and at least one compensation layer 220. The bulk acoustic wave resonance unit 210 includes an upper portion electrode 211, a piezoelectric layer 213, and a lower portion electrode 215. The lower portion electrode 215 is disposed on a membrane 225, the piezoelectric layer 213 is disposed on the lower portion electrode 215, and the upper portion electrode 211 is disposed on the piezoelectric layer 213.

The piezoelectric layer 213 includes a material that modifies a resonance frequency based on a change in an ambient temperature, and may have a TCF in a range from about −200 parts per million (ppm)/° C. to about 200 ppm/° C. Examples of the material included in the piezoelectric layer 213 include zinc oxide (ZnO), aluminum nitride (AlN), and the like. In this example, a TCF of ZnO is about −99 ppm/° C. and a TCF of AlN is about −26 ppm/° C.

The upper portion electrode 211 includes a material that modifies a resonance frequency based on a change in an ambient temperature. Examples of the material included in the upper portion electrode 211 include molybdenum (Mo), ruthenium (Ru), tungsten (W), platinum (Pt), aluminum (Al), gold (Au), and the like. In this example, a TCF of the material included in the upper portion electrode 211 may be in a range from about −200 ppm/° C. to about 200 ppm/° C.

The lower portion electrode 215 includes a material that modifies a resonance frequency based on a change in an ambient temperature. Examples of the material include Mo, Ru, W, Pt, Al, Au, and the like. In this example, a TCF of the material included in the lower portion electrode 215 may be in a range from about −200 ppm/° C. to about 200 ppm/° C.

The material included in the upper portion electrode 211 and the material included in the lower portion electrode 215 may be the same, or may be different from each other. A TCF of the bulk acoustic wave resonance unit 210 is determined based on the TCF of the upper portion electrode 211, the TCF of the piezoelectric layer 213, and the TCF of the lower portion electrode 215. The TCF of the bulk acoustic wave resonator 210 may be in a range from about −200 ppm/° C. to about 200 ppm/° C.

At least one compensation layer 220 includes a compensation layer 221 and a compensation layer 223. The compensation layer 221 is disposed on the upper portion electrode 211, and the compensation layer 223 is disposed below the lower portion electrode 215. The membrane 225 supporting the bulk acoustic wave resonance unit 210 is disposed between the lower portion electrode 215 and the compensation layer 223. The compensation layer 223 may be formed by doping a portion of the membrane 225 with an impurity element.

The compensation layer 221 and the compensation layer 223 include a material that modifies a resonance frequency based on a change in an ambient temperature. In particular, the compensation layer 221 and the compensation layer 223 include a material that adjusts a resonance frequency that is modified in the bulk acoustic wave resonance unit 210 based on a change in an ambient temperature in a direction opposite to a direction of the modification. The material included in the compensation layer 221 and the compensation layer 223 may include a silicon oxide-based material or a silicon nitride-based material. In this example, a TCF of the material included in the compensation layer 221 and the compensation layer 223 may be in a range from about 200 ppm/° C. to about 200 ppm/° C.

The compensation layer 221 and the compensation layer 223 may be formed by doping silicon oxide ($SiO_2$) or silicon nitride ($Si_3N_4$) with an impurity element. The TCF of the compensation layer 221 and the compensation layer 223 may be more finely adjusted by the doping with an impurity element. An example of the impurity element may include at least one element selected from the group consisting of arsenic (As), antimony (Sb), phosphorus (P), boron (B), germanium (Ge), silicon (Si), and aluminum (Al). For example, the impurity element may include one element selected from the group consisting of As, Sb, P, B, Ge, Si, and Al, or two elements selected from the group consisting of As, Sb, P, B, Ge, Si, and Al.

The impurity element may be deposited using an impurity gas including the impurity element based on an in-situ deposition simultaneously with deposition of $SiO_2$ or $Si_3N_4$. Alternatively, $SiO_2$ or $Si_3N_4$ may be doped with the impurity element by ion implantation after the $SiO_2$ or $Si_3N_4$ are deposited.

A sum of a thickness of the compensation layer 221 and a thickness of the compensation layer 223 may be less than or equal to a sum of a thickness of the upper portion electrode 211, a thickness of the piezoelectric layer 213, and a thickness of the lower portion electrode 215. The thickness of the compensation layer 221 and the thickness of the compensation layer 223 may be determined based on a Q factor of the bulk acoustic wave resonance unit 210. For example, the compensation layer 221 and the compensation layer 223 may be layered to be as thin as possible within a range allowed by available techniques. As a thickness of a compensation layer increases, the Q factor of the bulk acoustic wave resonance unit 210 decreases. A sum of the thickness of the compensation layer 221 and the thickness of the compensation layer 223 may be less than or equal to a value of 2 μm.

The compensation layer 221 and the compensation layer 223 adjust the TCF of the bulk acoustic wave resonance unit 210. For example, when the TCF of the bulk acoustic wave resonance unit 210 is less than or equal to −200 ppm/° C., the TCF of the compensation layer 221 and the compensation layer 223 may be about +200 ppm/° C., based on a material included in the compensation layer 221 and the compensation layer 223. Accordingly, a TCF of the BAWR may be adjusted to be close to zero, i.e., to be substantially zero, by using the compensation layer 221 and the compensation layer 223. Accordingly, the BAWR may have a low TCF.

The BAWR has a higher Q factor when thin compensation layers are disposed on an upper portion electrode and below a lower portion electrode, than when a single thick compensation layer is disposed on the upper portion electrode or disposed below the lower portion electrode.

Figure 3:
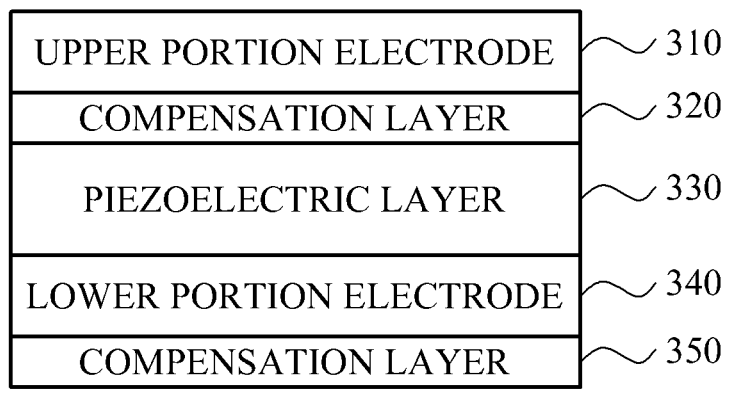
FIG. 3 illustrates another example of a BAWR.

FIG. 3 illustrates another example of a BAWR.

Referring to FIG. 3, the BAWR includes a bulk acoustic wave resonance unit and compensation layers. The bulk acoustic wave resonance unit includes an upper portion electrode 310, a piezoelectric layer 330, and a lower portion electrode 340. The lower portion electrode 340 is disposed on a compensation layer 350, the piezoelectric layer 330 is disposed on the lower portion electrode 340, and the upper portion electrode 310 is disposed on a compensation layer 320.

When compared to the BAWR of FIG. 2, the BAWR of FIG. 3 is different in that the compensation layer 320 is disposed on the piezoelectric layer 330 and below the upper portion electrode 310. Other descriptions associated with the upper portion electrode 310, the piezoelectric layer 330, the lower portion electrode 340, the compensation layer 320, and the compensation layer 350 are the same as the descriptions associated with the upper portion electrode 211, the piezoelectric layer 213, the lower portion electrode 215, and the compensation layers 221 and 223 of FIG. 2, and repeated descriptions will be omitted for conciseness.

Figure 4:
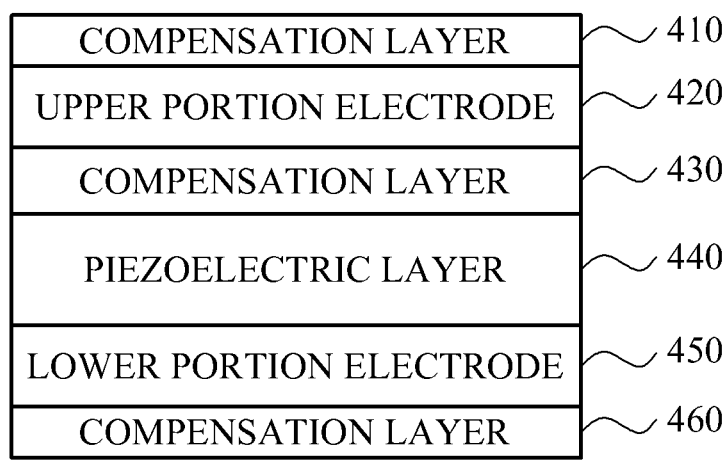
FIG. 4 illustrates another example of a BAWR.

FIG. 4 illustrates another example of a BAWR.

Referring to FIG. 4, the bulk acoustic wave resonance unit includes an upper portion electrode 420, a piezoelectric layer 440, and a lower portion electrode 450. The lower portion electrode 450 is disposed on a compensation layer 460, the piezoelectric layer 440 is disposed on the lower portion electrode 450, a compensation layer 430 is disposed on the piezoelectric layer 440, and the upper portion electrode 420 is disposed on the compensation layer 430 and below a compensation layer 410.

A sum of a thickness of the compensation layer 410, a thickness of the compensation layer 430, and a thickness of the compensation layer 460 may be less than or equal to a sum of a thickness of the upper portion electrode 420, a thickness of piezoelectric layer 440, and a thickness of the lower portion electrode 450.

When compared to the BAWR of FIG. 2, the BAWR of FIG. 4 is different in that the compensation layer 430 is additionally included on the piezoelectric layer 440 and below the upper portion electrode 420. Other descriptions associated with the upper portion electrode 420, the piezoelectric layer 440, the lower portion electrode 450, the compensation layer 410, and the compensation layer 460 are the same as the descriptions associated with the upper portion electrode 211, the piezoelectric layer 213, the lower portion electrode 215, and the compensation layers 221 and 223 of FIG. 2, and repeated descriptions will be omitted for conciseness.

Figure 5:
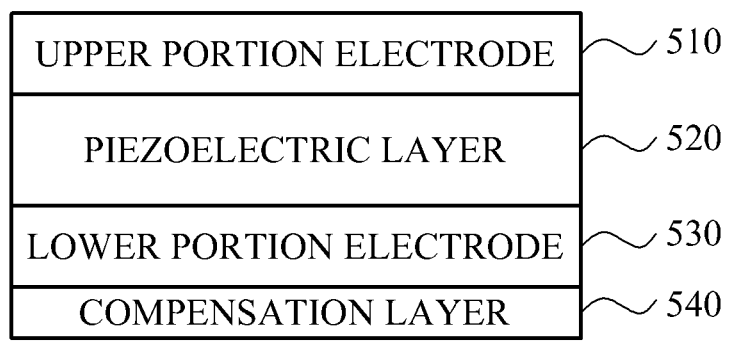
FIG. 5 illustrates another example of a BAWR.

FIG. 5 illustrates another example of a BAWR.

Referring to FIG. 5, the bulk acoustic wave resonance unit includes an upper portion electrode 510, a piezoelectric layer 520, and a lower portion electrode 530. The lower portion electrode 530 is disposed on a compensation layer 540, the piezoelectric layer 520 is disposed on the lower portion electrode 530, and the upper portion electrode 510 is disposed on the piezoelectric layer 520.

A thickness of the compensation layer 540 may be less than or equal to a sum of a thickness of the upper portion electrode 510, a thickness of the piezoelectric layer 520, a thickness of the lower portion electrode 530, or the thickness of the compensation layer 540 may be less than or equal to the thickness of the piezoelectric layer 520.

When compared to the BAWR of FIG. 2, the BAWR of FIG. 5 is different in that the single compensation layer 540 is used. A Q factor will be lower when a single compensation layer is used than when a plurality of compensation layers is used. Other descriptions associated with the upper portion electrode 510, the piezoelectric layer 520, the lower portion electrode 530, and the compensation layer 540 are the same as the descriptions associated with the upper portion electrode 211, the piezoelectric layer 213, the lower portion electrode 215, and the compensation layers 221 and 223 of FIG. 2, and repeated descriptions will be omitted for conciseness.

Figure 6:
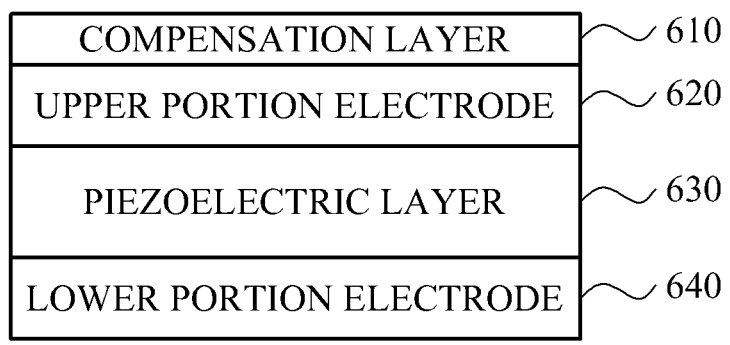
FIG. 6 illustrates another example of a BAWR.

FIG. 6 illustrates another example of a BAWR.

Referring to FIG. 6, a bulk acoustic wave resonance unit includes an upper portion electrode 620, a piezoelectric layer 630, and a lower portion electrode 640. The piezoelectric layer 630 is disposed on the lower portion electrode 640, and the upper portion electrode 620 is disposed on the piezoelectric layer 630. A compensation layer 610 is disposed on the upper portion electrode 620. A thickness of the compensation layer 610 may be less than or equal to a sum of a thickness of the upper portion electrode 620, a thickness of the piezoelectric layer 630, and a thickness of the lower portion electrode 640, or the thickness of the compensation layer 610 may be less than or equal to the thickness of the piezoelectric layer 630.

When compared to the BAWR of FIG. 5, the BAWR of FIG. 6 is different in that the compensation layer 610 is disposed on the upper portion electrode 620. Other descriptions associated with the upper portion electrode 620, the piezoelectric layer 630, the lower portion electrode 640, and the compensation layer 610 are the same as the descriptions associated with the upper portion electrode 211, the piezoelectric layer 213, the lower portion electrode 215, and the compensation layers 221 and 223 of FIG. 2, and repeated descriptions will be omitted for conciseness.

Figure 7:
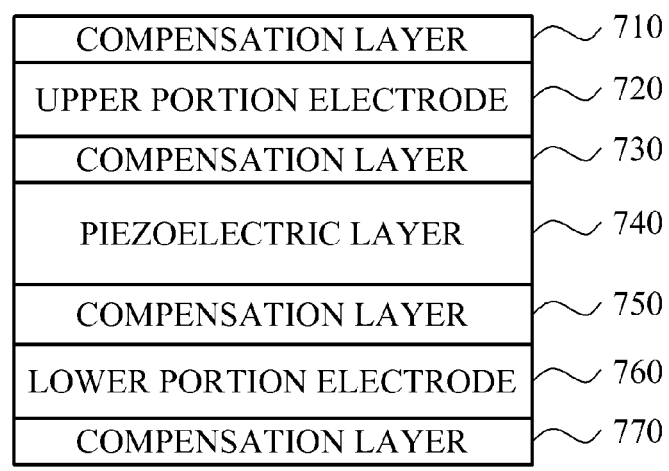
FIG. 7 illustrates another example of a BAWR.

FIG. 7 illustrates another example of a BAWR.

Referring to FIG. 7, the bulk acoustic wave resonance unit includes an upper portion electrode 720, a piezoelectric layer 740, and a lower portion electrode 760. The lower portion electrode 760 is disposed on a compensation layer 770 and below a compensation layer 750. The piezoelectric layer 740 is disposed on the compensation layer 750 and below a compensation layer 730. The upper portion electrode 720 is disposed on the compensation layer 730 and below a compensation layer 710.

A passivation layer (not illustrated) may be disposed on the upper portion electrode 720. The compensation layer 710 may be formed by doping a portion of the passivation layer with an impurity element. A sum of a thickness of the compensation layer 710, a thickness of the compensation layer 730, a thickness of the compensation layer 750, and a thickness of the compensation layer 770 may be less than or equal to a sum of a thickness of the upper portion electrode 720, a thickness of the piezoelectric layer 740, and a thickness of the lower portion electrode 760, or may be less than or equal to the thickness of the piezoelectric layer 740.

When compared to the BAWR of FIG. 2, the BAWR of FIG. 7 is different in that the compensation layer 730 is additionally disposed on the piezoelectric layer 740 and below the upper portion electrode 720, and the compensation layer 750 is additionally disposed on the lower portion electrode 760 and below the piezoelectric layer 740. Other descriptions associated with the upper portion electrode 720, the piezoelectric layer 740, the lower portion electrode 760, the compensation layers 710 and 770 are the same as the descriptions associated with the upper portion electrode 211, the piezoelectric layer 213, the lower portion electrode 215, and the compensation layers 221 and 223 of FIG. 2, and repeated descriptions will be omitted for conciseness.

Figure 8:
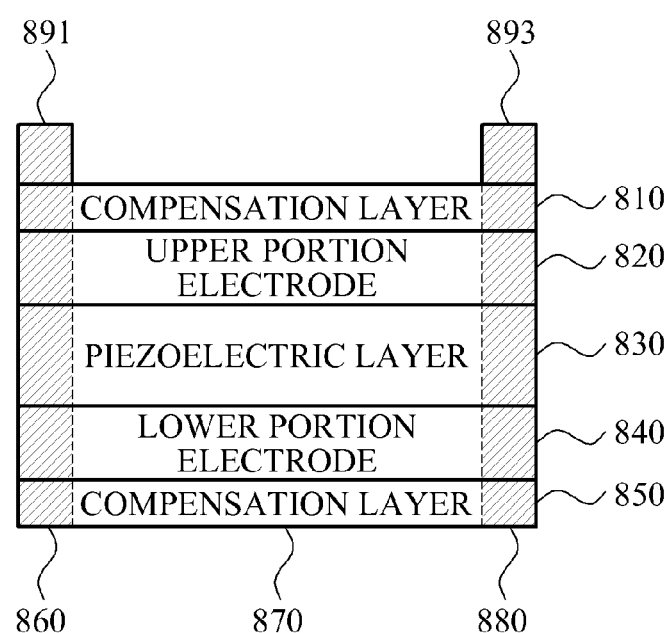
FIG. 8 illustrates an example of a BAWR in which a Q factor of the BAWR is adjusted.

FIG. 8 illustrates an example of a BAWR in which a Q factor of the BAWR is adjusted.

Referring to FIG. 8, the BAWR includes a bulk acoustic wave resonance unit and compensation layers 810 and 850. The bulk acoustic wave resonance unit includes an upper portion electrode 820, a piezoelectric layer 830, and a lower portion electrode 840. The lower portion electrode 840 is disposed on a compensation layer 850, the piezoelectric layer 830 is disposed on the lower portion electrode 840, and the upper portion electrode 820 is disposed on the piezoelectric layer 830. The compensation layer 810 is disposed on the upper portion electrode 820, and the compensation layer 850 is disposed below the lower portion electrode 840.

To improve a Q factor of the BAWR, property compensation layers 891 and 893 are disposed on portions of the compensation layer 810. In particular, when the property compensation layers 891 and 893 are provided, the Q factor of the BAWR increases. A thickness of the property compensation layers 891 and 893 may be selected to provide a desired Q factor. Examples of a material included in the property compensation layers 891 and 893 may be varied. For example, the material included in the property compensation layers 891 and 893 may be a material included in the compensation layer 810, which may be, for example, silicon oxide ($SiO_2$) or silicon nitride ($Si_3N_4$) doped with an impurity element. An example of the impurity element may include at least one element selected from the group consisting of arsenic (As), antimony (Sb), phosphorus (P), boron (B), germanium (Ge), silicon (Si), and aluminum (Al) For example, the impurity element may include one element selected from the group consisting of As, Sb, P, B, Ge, Si, and Al, or two elements selected from the group consisting of As, Sb, P, B, Ge, Si, and Al. The property compensation layer 891 and the property compensation layer 893 may have structures connected to each other. The property compensation layers 891 and 893 may be disposed on edges of an upper portion of the compensation layer 810 as shown in FIG. 8 so that an interior of the upper portion of the compensation layer 810 may be empty.

In the BAWR in FIG. 8, thicknesses of portions 860 and 880 in which the property compensation layers 891 and 893 are provided are different from a thickness of a portion 870 in which a property compensation layer is not provided. Accordingly, the difference in thickness causes a difference in impedance between the portions 860 and 880 and the portion 870.

In response to a high frequency potential being provided to the upper portion electrode 820 and the lower portion electrode 840, the piezoelectric layer 830 will oscillate. In this example, an acoustic wave is generated in a vertical direction from the upper portion electrode 820 to the lower portion electrode 840 and an acoustic wave is generated in a horizontal direction. When there is a difference in thickness between the portions 860 and 880 and the portion 870 in the BAWR, a difference in impedance will occur, and therefore the acoustic wave in the horizontal direction will be reflected from the portions 860 and 880. Therefore, the BAWR will not lose the acoustic wave in the horizontal direction, and therefore the reflection characteristic will be improved. Also, the Q factor of the BAWR may be improved as the reflection characteristic is improved.

In addition to the example shown in FIG. 8, when there is a difference in thickness between layered portions in a BAWR, a difference in impedance will occur, and therefore the reflection characteristic may be improved. Therefore, various schemes to create a difference in thickness between different portions in the BAWR may be employed.

Figure 9:
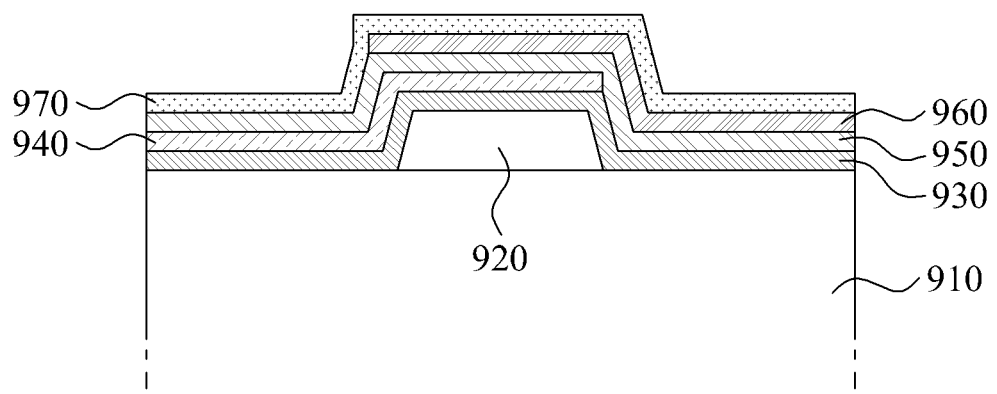
FIG. 9 is a sectional view illustrating an example of a layered structure of a BAWR.

FIG. 9 is a sectional view illustrating a layered structure of a BAWR.

Referring to FIG. 9, the BAWR includes a substrate 910, an air cavity 920, a bulk acoustic wave resonance unit, compensation layer 930, and a compensation layer 970.

The air cavity 920 is disposed on a portion of the substrate 910. The air cavity 920 creates a change in an impedance of the BAWR to improve an acoustic wave reflection characteristic. The air cavity may be filled with air, or may be filled with a dielectric substance. Example of a suitable dielectric substance include an inert gas, $SiO_2$, $Si_3N_4$, polysilicon, a polymer, and the like.

The bulk acoustic wave resonance unit includes a first electrode 960, a second electrode 940, and a piezoelectric layer 950. The first electrode 960 corresponds to an upper portion electrode and the second electrode 940 corresponds to a lower portion electrode. In this example, based on the piezoelectric layer 950, the electrodes are classified as the upper portion electrode and the lower portion electrode. The second electrode 940 is disposed on the compensation layer 930. In this example, a membrane that supports the bulk acoustic wave resonance unit may be provided between the second electrode 940 and the air cavity 920, and between the second electrode 940 and the substrate 910 where there is no air cavity 920. The compensation layer 930 may be formed by doping a portion of the membrane with an impurity element. The piezoelectric layer 950 is disposed on the second electrode 940. The first electrode 960 is disposed on the piezoelectric layer 950. The first electrode 960, the piezoelectric layer 950, and the second electrode 940 include a material that modifies a resonance frequency based on a change in an ambient temperature. Examples of the material included in the piezoelectric layer 950 are ZnO, AlN, quartz, and the like. Examples of the material included in the first electrode 960 and the second electrode 940 are Mo, Ru, W, Pt, Al, Au, and the like.

The material included in the first electrode 960 and the material included in the second electrode 940 may be the same, or may be different from each other. Accordingly, a TCF of the bulk acoustic wave resonance unit is determined based on a TCF of the first electrode 960, a TCF of the piezoelectric layer 950, and the TCF of the second electrode 940. The TCF of the bulk acoustic wave resonance unit may be in a range from about −200 ppm/° C. to about 200 ppm/° C.

The compensation layer 930 is disposed on the substrate 910 and the air cavity 920. The compensation layer 970 is disposed on the first electrode 960. The compensation layer 930 and the compensation layer 970 include a material that modifies a resonance frequency that is modified in the bulk acoustic wave resonance unit based on a change in an ambient temperature in a direction opposite to a direction of the modification. Examples of the material include a silicon oxide-based material or a silicon nitride-based material. In this example, a TCF of the material may be in a range from about −200 ppm/° C. to about 200 ppm/° C.

The compensation layer 930 and the compensation layer 970 adjust the TCF of the bulk acoustic wave resonance unit so that a TCF of the BAWR has a value close to zero.

A BAWR manufacturing method according to an example sequentially layers a silicon oxide film, a silicon nitride film, and a sacrificial layer on the substrate 910. Examples of a sacrificial material included in the sacrificial layer are polysilicon and a polymer. The silicon oxide film and the silicon nitride film may be used to protect the substrate 910 from etching. The silicon oxide film and the silicon nitride film may be replaced with another material that protects the substrate 910 from etching, or may be omitted when one of ordinary skill in the art determines that a suitable result can be obtained with the particular manufacturing process and technique being employed without using the silicon oxide film and the silicon nitride film or the other material.

The sacrificial layer is patterned on the substrate 910 to have a shape of the air cavity 920 to be formed below the bulk acoustic wave resonance unit. The shape of the air cavity 920 may be selected to provide an appropriate Q factor for the BAWR. The compensation layer 930 and a first conductive layer are sequentially layered on the patterned sacrificial layer. The compensation layer 930 may be layered to have a thickness less than or equal to a sum of a thickness of the second electrode 940, a thickness of the piezoelectric layer 950, and a thickness of the first electrode 960, or may be layered to have a thickness less than or equal to the thickness of the piezoelectric layer 950. The second electrode 940 is patterned on the first conductive layer. The second electrode 940 shown in FIG. 9 is formed on only a portion of the compensation layer 930, but may have other configurations. The piezoelectric layer 950 and a second conductive layer are sequentially layered on the second electrode 940 and on a portion of the compensation layer 930 not covered by the second electrode 940. The first electrode 960 is patterned on the second conductive layer. The first electrode 960 shown in FIG. 9 is formed on only a portion of the piezoelectric layer 950, but may have other configurations. The compensation layer 970 is layered on the first electrode 960 and on a portion of the piezoelectric layer 950 not covered by the first electrode 960. The air cavity 920 below the bulk acoustic resonance unit is formed by removing the sacrificial layer patterned on substrate 910. Various techniques for removing the sacrificial layer are well known to one of ordinary skill in the art, and therefore will not be described in detail herein. After the air cavity 920 has been formed, the air cavity may be filled with air or a dielectric material as described above.

The compensation layer 930 and the compensation layer 970 may include a silicon oxide-based material or a silicon nitride-based material.

The compensation layer 930 and the compensation layer 970 may be formed by depositing an impurity element using an impurity gas including the impurity element based on an in-situ deposition simultaneously with deposition of $SiO_2$ or $Si_3N_4$. Alternatively, the compensation layer 930 and the compensation layer 970 may be formed by doping $SiO_2$ or $Si_3N_4$ with the impurity element by ion implantation after the $SiO_2$ or $Si_3N_4$ are deposited.

FIGS. 10 through 18 are sectional views illustrating other examples of a layered structure of a BAWR.

Figure 10:
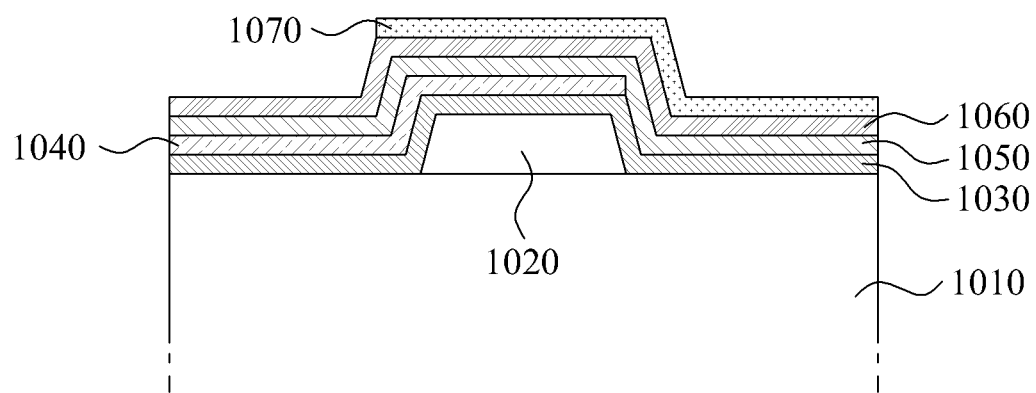
FIGS. 10 through 18 are sectional views illustrating other examples of a layered structure of a BAWR.

Referring to FIG. 10, an air cavity 1020 is disposed on a portion of a substrate 1010, and a compensation layer 1030 is disposed on the air cavity 1020 and on a portion of the substrate 1010 not covered by the air cavity 1020. A lower portion electrode 1040 is disposed on a portion of the compensation layer 1030, and a piezoelectric layer 1050 is disposed on the lower portion electrode 1040 and on a portion of the compensation layer 1030 not covered by the lower portion electrode 1040. A compensation layer 1060 is disposed on the piezoelectric layer 1050, and an upper portion electrode 1070 is disposed on a portion of the compensation layer 1060. When compared to the BAWR of FIG. 9, the BAWR of FIG. 10 is different in that the compensation layer 1060 is below the upper portion electrode 1070.

Figure 11:
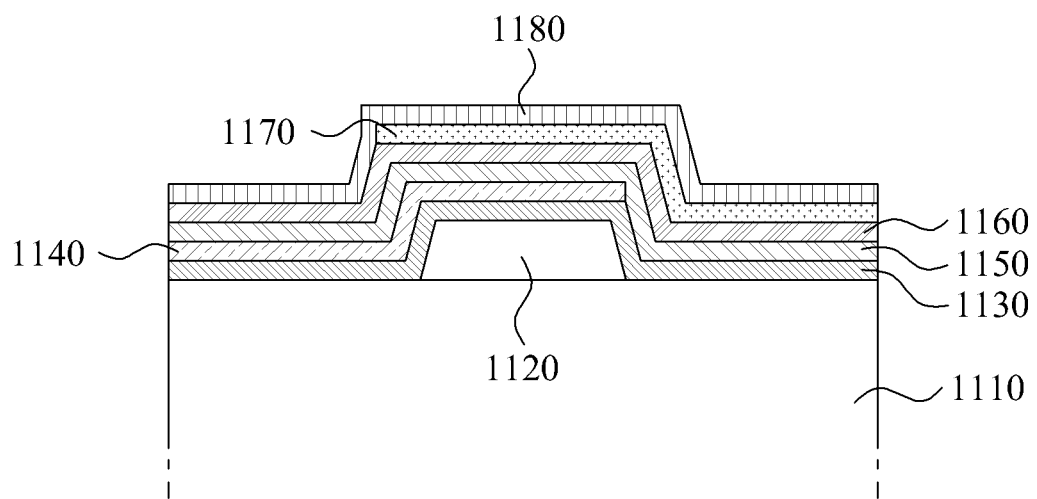

Referring to FIG. 11, an air cavity 1120 is disposed on a portion of a substrate 1110, and a compensation layer 1130 is disposed on the air cavity 1120 and on a portion of the substrate 1110 not covered by the air cavity 1120. A lower portion electrode 1140 is disposed on a portion of the compensation layer 1130, and a piezoelectric layer 1150 is disposed on the lower portion electrode 1140 and on a portion of the compensation layer 1130 not covered by the lower portion electrode 1140. A compensation layer 1160 is disposed on the piezoelectric layer 1150, and an upper portion electrode 1170 is disposed on a portion of the compensation layer 1160. A compensation layer 1180 is disposed on the upper portion electrode 1170 and on a portion of the compensation layer 1160 not covered by the upper portion electrode 1170. When compared to the BAWR of FIG. 9, the BAWR of FIG. 11 is different in that the compensation layer 1160 is additionally included below the upper portion electrode 1170.

Figure 12:
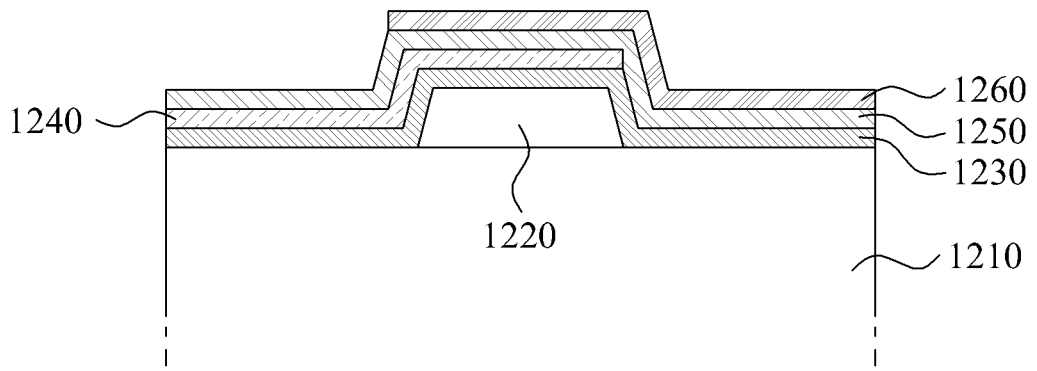

Referring to FIG. 12, an air cavity 1220 is disposed on a portion of a substrate 1210, and a compensation layer 1230 is disposed on the air cavity 1220 and on a portion of the substrate 1210 not covered by the air cavity 1220. A lower portion electrode 1240 is disposed on a portion of the compensation layer 1230, and a piezoelectric layer 1250 is disposed on the lower portion electrode 1240 and on a portion of the compensation layer 1230 not covered by the lower portion electrode 1240. An upper portion electrode 1260 is disposed on a portion of the piezoelectric layer 1250. When compared to the BAWR of FIG. 9, the BAWR of FIG. 12 is different in that the single compensation layer 1230 is used.

Figure 13:
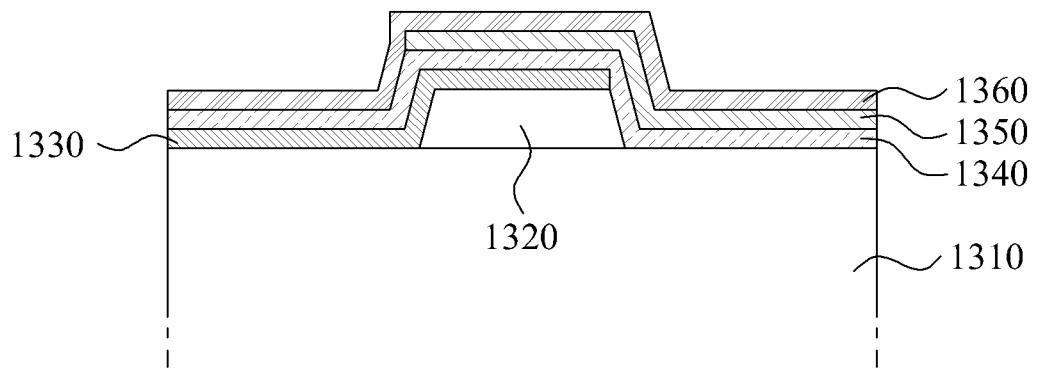

Referring to FIG. 13, an air cavity 1320 is disposed on a portion of a substrate 1310, and a lower portion electrode 1330 is disposed on the air cavity 1320 and on a portion of the substrate 1310 not covered by the air cavity 1320. A piezoelectric layer 1340 is disposed on the lower portion electrode 1330 and on a portion of the substrate 1310 not covered by the lower portion electrode 1330, and an upper portion electrode 1350 is disposed on a portion of the piezoelectric layer 1340. A compensation layer 1360 is disposed on the upper portion electrode 1350 and on a portion of the piezoelectric layer 1340 not covered by the upper portion electrode 1350. When compared to the BAWR of FIG. 9, the BAWR of FIG. 13 is different in that the single compensation layer 1360 is used.

Figure 14:
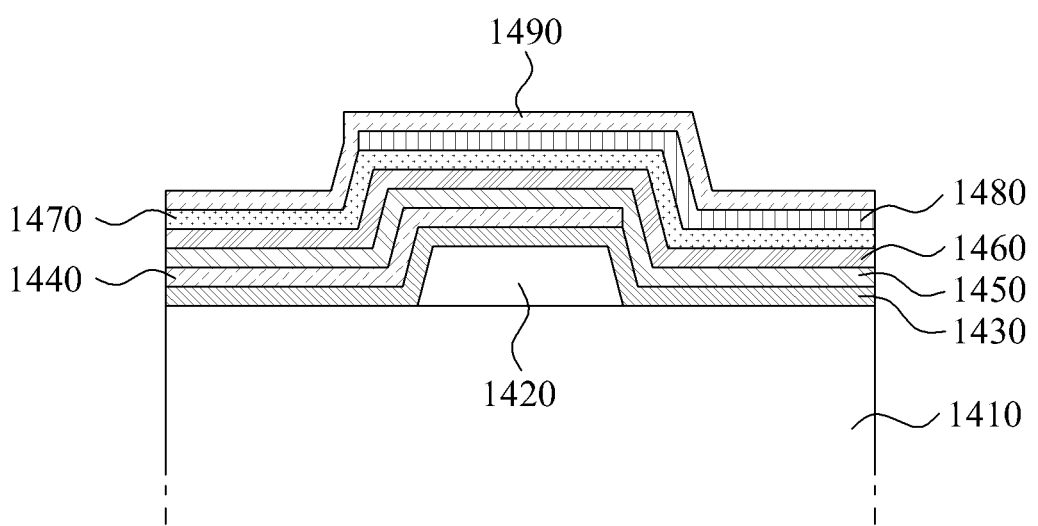

Referring to FIG. 14, an air cavity 1420 is disposed on a portion of a substrate 1410, and a compensation layer 1430 is disposed on the air cavity 1420 and on a portion of the substrate 1410 not covered by the air cavity 1420. A lower portion electrode 1440 is disposed on a portion of the compensation layer 1430. A compensation layer 1450 is disposed on the lower portion electrode 1440 and on a portion of the compensation layer 1430 not covered by the lower portion electrode 1440. A piezoelectric layer 1460 is disposed on the compensation layer 1450. A compensation layer 1470 is disposed on the piezoelectric layer 1460. An upper portion electrode 1480 is disposed on a portion of the compensation layer 1470. A compensation layer 1490 is disposed on the upper portion electrode 1480 and on a portion of the compensation layer 1470 not covered by the upper portion electrode 1480. When compared to the BAWR of FIG. 9, the BAWR of FIG. 14 is different in that the compensation layer 1450 is additionally disposed on the lower portion electrode 1440, and the compensation layer 1470 is additionally disposed below the upper portion electrode 1480.

Figure 15:
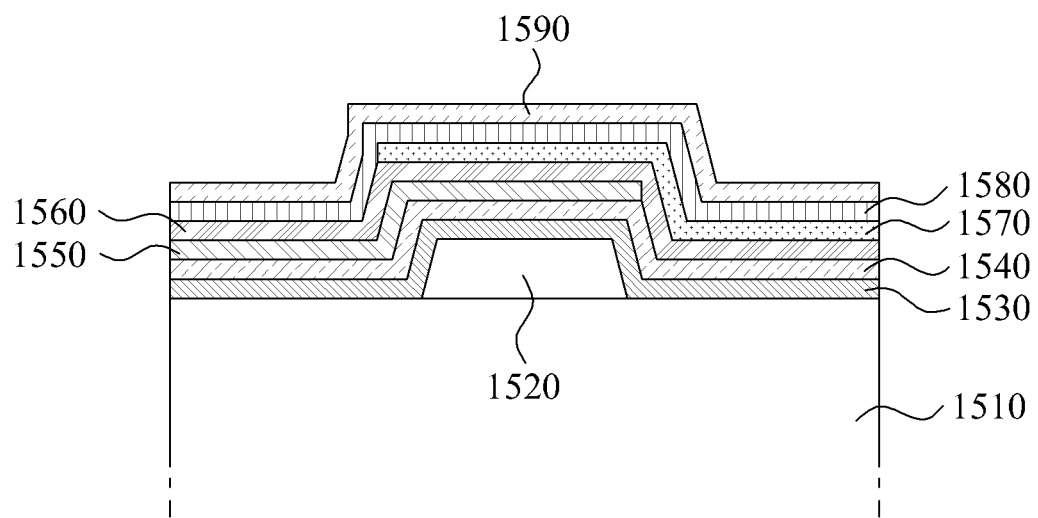

Referring to FIG. 15, an air cavity 1520 is disposed on a portion of a substrate 1510, and a compensation layer 1530 is disposed on the air cavity 1520 and on a portion of the substrate 1510 not covered by the air cavity 1520. A compensation layer 1540 is disposed on the compensation layer 1530, and a lower portion electrode 1550 is disposed on a portion of the compensation layer 1540. A piezoelectric layer 1560 is disposed on the lower portion electrode 1550 and on a portion of the compensation layer 1540 not covered by the lower portion electrode 1550. An upper portion electrode 1570 is disposed on a portion of the piezoelectric layer 1560, and a compensation layer 1580 is disposed on the upper portion electrode 1570 and on a portion of the piezoelectric layer 1560 not covered by the upper portion electrode 1570. The compensation layer 1590 is disposed on the compensation layer 1580. When compared to the BAWR of FIG. 9, the BAWR of FIG. 15 is different in that the compensation layer 1540 is additionally disposed below the lower portion electrode 1550, and the compensation layer 1590 is additionally disposed. When thicknesses of compensation layers included in a BAWR are equal, in a case where two or more layered compensation layers are separately disposed on or below an upper portion electrode or disposed on or below a lower portion electrode as shown in FIG. 15, a Q factor of the BAWR is improved.

Figure 16:
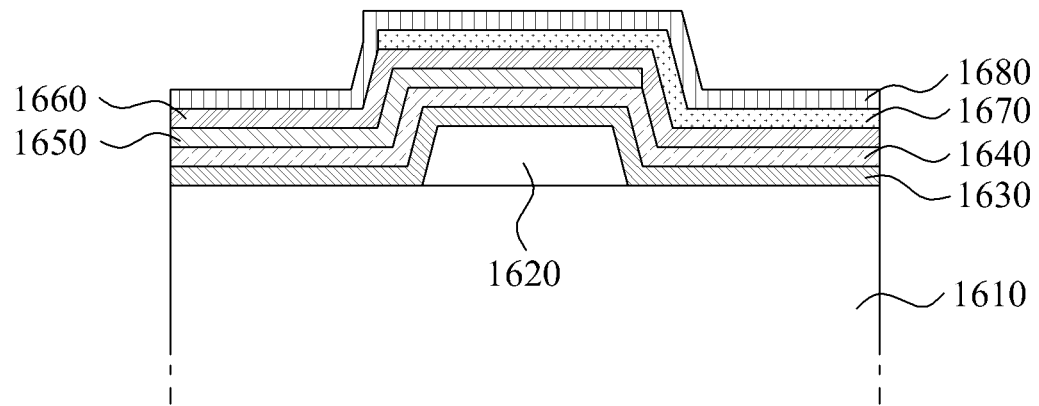

Referring to FIG. 16, an air cavity 1620 is disposed on a portion of a substrate 1610, and a compensation layer 1630 is disposed on the air cavity 1620 and on a portion of the substrate 1610 not covered by the air cavity 1620. A compensation layer 1640 is disposed on the compensation layer 1630, and a lower portion electrode 1650 is disposed on a portion of the compensation layer 1640. A piezoelectric layer 1660 is disposed on the lower portion electrode 1650 and on a portion of the compensation layer 1640 not covered by the lower portion electrode 1650. An upper portion electrode 1670 is disposed on a portion of the piezoelectric layer 1660, and a compensation layer 1680 is disposed on the upper portion electrode 1670 and on a portion of the piezoelectric layer 1660 not covered by the upper portion electrode 1670. When compared to the BAWR of FIG. 9, the BAWR of FIG. 16 is different in that the compensation layers 1630 and 1640 are both included, as opposed to the single compensation layer 930.

Figure 17:
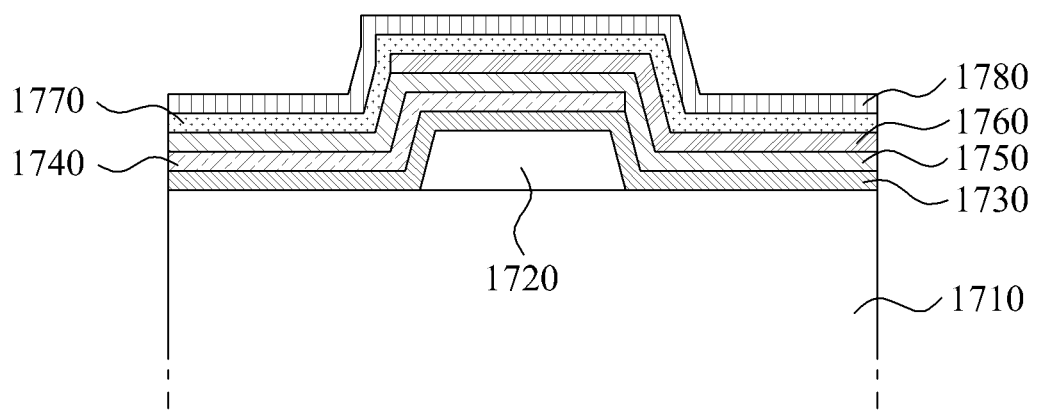

Referring to FIG. 17, an air cavity 1720 is disposed on a portion of a substrate 1710, and a compensation layer 1730 is disposed on the air cavity 1720 and on a portion of the substrate 1710 not covered by the air cavity 1720. A lower portion electrode 1740 is disposed on a portion of the compensation layer 1730. A piezoelectric layer 1750 is disposed on the lower portion electrode 1740 and on a portion of the compensation layer 1730 not covered by the lower portion electrode 1740. An upper portion electrode 1760 is disposed on a portion of the piezoelectric layer 1750, and a compensation layer 1770 is disposed on the upper portion electrode 1760 and on a portion of the piezoelectric layer 1750 not covered by the upper portion electrode 1760. A compensation layer 1780 is disposed on the compensation layer 1770. When compared to the BAWR of FIG. 9, the BAWR of FIG. 17 is different in that the compensation layers 1770 and 1780 are both disposed, as opposed to the single compensation layer 970. That is, another compensation layer is further added.

Figure 18:
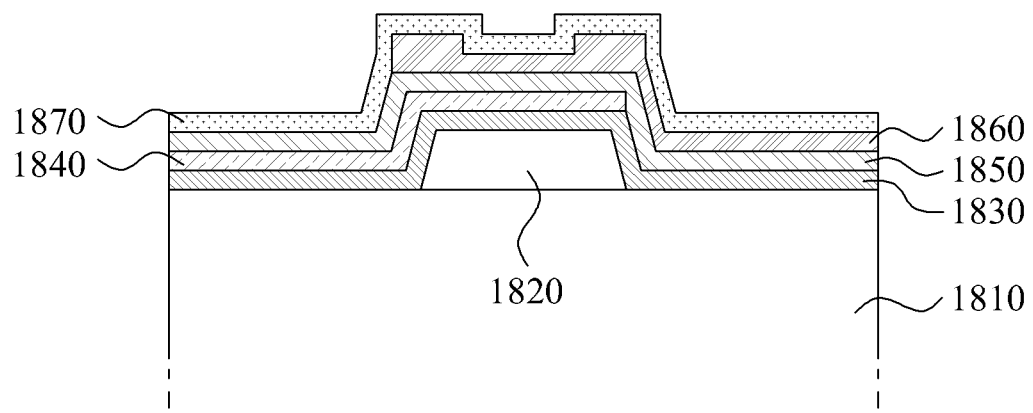

Referring to FIG. 18, a BAWR includes a substrate 1810, an air cavity 1820, a bulk acoustic wave resonance unit, a compensation layer 1830, and a compensation layer 1870. The air cavity 1820 is disposed on a portion of the substrate 1810. The air cavity 1820 changes an impedance of the BAWR to improve an acoustic wave reflection characteristic.

The bulk acoustic wave resonance unit includes a lower portion electrode 1840, a piezoelectric layer 1850, and an upper portion electrode 1860. The upper portion electrode 1860 is layered so that at least one area of the upper portion electrode 1860 has a different thickness than a remaining area of the upper portion electrode 1860. A difference in thickness causes a difference in impedance between areas having different thicknesses. Due to the difference in impedance, an acoustic wave reflection characteristic is improved, and an electric characteristic of the BAWR is improved. The at least one area having the different thickness may be formed by removing or etching a layered sacrificial layer.

Figure 19:
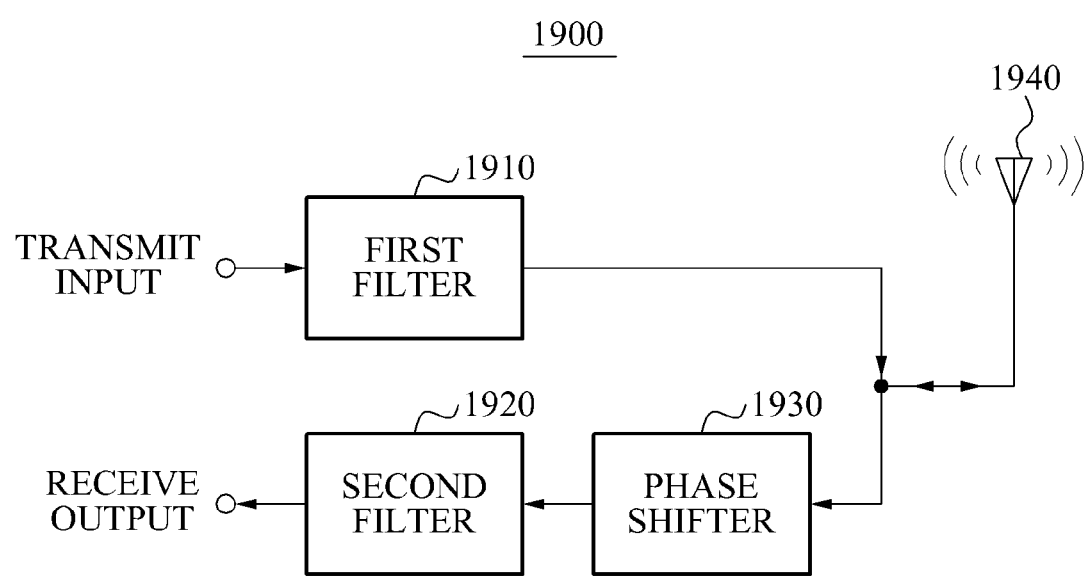
FIG. 19 is a block diagram of an example of a duplexer.

FIG. 19 is a block diagram of an example of a duplexer.

Referring to FIG. 19, a duplexer 1900 includes a first filter 1910, a second filter 1920, and a phase shifter 1930. The first filter 1910 is configured to filter a transmission signal received from a transmit input of the duplexer 1900, and output the filtered transmission signal to an antenna 1940. The phase shifter 1930 is configured to shift a phase of a received signal received from the antenna 1940 to prevent signal interference between the first filter 1910 and the second filter 1920, and output the phase-shifted received signal to the second filter 1920. The second filter 1920 is configured to filter the phase-shifted received signal received from the phase shifter 1930, and output the filtered phase-shifted received signal to a receive output of the duplexer 1900.

The first filter 1910 and the second filter 1920 operate at different predetermined resonance frequencies. The resonance frequencies of the first filter 1910 and the second filter 1920 may be adjusted to be different from each other by adjusting thicknesses of corresponding piezoelectric layers to be different from each other. Each of the first filter 1910 and the second filter 1920 includes a bulk acoustic wave resonance unit and at least one compensation layer. The bulk acoustic wave resonance unit includes a lower portion electrode, a piezoelectric layer, and an upper portion electrode, each of which include a material that modifies a resonance frequency based on a change in a temperature. The at least one compensation layer includes a material that adjusts the resonance frequency modified based on the change in the temperature in a direction opposite to a direction of the modification to adjust a TCF of the bulk acoustic wave resonance unit.

Several examples have been described above. Nevertheless, it should be understood that various modifications may be made in these examples. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the claims and their equivalents.

What is claimed is:

1. A film bulk acoustic wave resonator (BAWR) comprising:
   a substrate;
   an air cavity disposed between the substrate and a bulk acoustic resonance unit;
   the bulk acoustic resonance unit comprising:
   a first electrode,
   a second electrode, and
   a piezoelectric layer disposed between the first electrode and the second electrode;
   a plurality of compensation layers comprising respective materials that adjusts a resonance frequency that is modified in the bulk acoustic resonance unit according to a temperature; and
   a property compensation layer included above the plurality of compensation layers,
   wherein the first electrode is disposed above the piezoelectric layer and the second electrode is disposed below the piezoelectric layer,
   wherein the plurality of compensation layers comprises:
   a first compensation layer disposed above the first electrode;
   a second compensation layer disposed below the second electrode; and
   a third compensation layer disposed below the second electrode, and
   wherein the property compensation layer is included above the edges of a surface of the first compensation layer so that a remaining portion of the surface between the edges is not covered by the property compensation layer.

2. The BAWR of claim 1, wherein the compensation layers adjust a temperature coefficient of the bulk acoustic wave resonance unit.

3. The BAWR of claim 1, wherein a sum of a thickness of each of the compensation layers is less than or equal to a sum of a thickness of the first electrode, a thickness of the piezoelectric layer, and a thickness of the second electrode.

4. The BAWR of claim 1, wherein a sum of a thickness of each of the compensation layers is less than or equal to 2 micrometers (μm).

5. The BAWR of claim 1, wherein the compensation layers comprise a silicon oxide-based material.

6. The BAWR of claim 1, wherein the compensation layers comprise a silicon nitride-based material.

7. The BAWR of claim 1, wherein the compensation layers comprise silicon oxide doped with an impurity.

8. The BAWR of claim 7, wherein the impurity comprises at least one element selected from the group consisting of arsenic (As), antimony (Sb), phosphorus (P), boron (B), germanium (Ge), silicon (Si), and aluminum (Al).

9. The BAWR of claim 1, wherein the compensation layers comprise silicon nitride doped with an impurity.

10. The BAWR of claim 9, wherein the impurity comprises at least one element selected from the group consisting of arsenic (As), antimony (Sb), phosphorus (P), boron (B), germanium (Ge), silicon (Si), and aluminum (Al).

11. The BAWR of claim 1, further comprising a membrane contacting the bulk acoustic resonance unit;
   wherein the compensation layers comprise a compensation layer that is a portion of the membrane that has been doped with an impurity.

12. The BAWR of claim 1, wherein a sum of a temperature coefficient of frequency (TCF) of the bulk acoustic wave resonance unit and a TCF of the plurality of compensation layers is substantially zero.

13. The BAWR of claim 1, wherein each of the first electrode, the second electrode, and the piezoelectric layer comprises respective materials that modify the resonance frequency based on the temperature, and
   wherein the respective materials of the plurality of compensation layers adjust the resonance frequency modified based on the temperature in a direction opposite to a direction of the modification by the first electrode, the second electrode, and the piezoelectric layer.

14. The BAWR of claim 1, wherein the plurality of compensation layers further comprises,
   a fourth compensation layer disposed below the first compensation layer.

15. The BAWR of claim 1, wherein the first electrode abuts the piezoelectric layer, the piezoelectric layer abuts the second electrode, and the second electrode abuts the second compensation layer.

16. The BAWR of claim 1, wherein a portion of the third compensation layer abuts the air cavity.

17. The BAWR of claim 1, wherein a portion of the first electrode, above the air cavity, is thicker than another portion of first electrode, above the air cavity, to affect an acoustic wave reflection characteristic of the bulk acoustic resonance unit.

18. The BAWR of claim 1, wherein the property compensation layer comprises an electrically conductive metal element.

19. The BAWR of claim 18, wherein the metal element comprises Al.

20. The BAWR of claim 18, wherein the property compensation layer comprises a first material doped with the metal element.

21. The BAWR of claim 20, wherein the first material is a silicon oxide or silicon nitride material.

22. A film bulk acoustic wave resonator (BAWR) comprising:
   a substrate;
   an air cavity disposed below a second electrode;
   a bulk acoustic wave resonance unit comprising:
   a first electrode disposed so that the air cavity is between the first electrode and the substrate,
   the second electrode disposed between the first electrode and the air cavity, and
   a piezoelectric layer disposed between the first electrode and the second electrode;
   a first compensation layer disposed above the first electrode;
   a second compensation layer disposed below the second electrode; and
   a third compensation layer disposed below the second electrode,
   wherein the first compensation layer, the second compensation layer and the third compensation layer comprise a silicon nitride-based material.

23. The BAWR of claim 22, wherein a sum of a thickness of the first compensation layer and a thickness of the second compensation layer is less than or equal to a sum of a thickness of the first electrode, a thickness of the piezoelectric layer, and a thickness of the second electrode.

24. The BAWR of claim 22, comprising a fourth compensation layer disposed below the first compensation layer.

25. The BAWR of claim 22, wherein the first compensation layer, the second compensation layer and the third compensation layer comprise silicon nitride doped with an impurity.

26. The BAWR of claim 25, wherein the impurity comprises at least one element selected from the group consisting of arsenic (As), antimony (Sb), phosphorus (P), boron (B), germanium (Ge), silicon (Si), and aluminum (Al).

27. A duplexer comprising:
   a first filter configured to filter a transmission signal received from a transmit input of the duplexer, and output the filtered transmission signal to an antenna;
   a phase shifter configured to shift a phase of a received signal received from the antenna, and output the phase-shifted received signal; and
   a second filter configured to filter the phase-shifted received signal output from the phase shifter, and output the filtered phase-shifted received signal to a receive output of the duplexer;
   wherein the first filter and the second filter operate at different predetermined resonance frequencies,
   wherein the phase shifter is further configured to shift the phase of the received signal to prevent signal interference between the first filter and the second filter,
   wherein each of the first filter and the second filter comprises:
   a film bulk acoustic source resonance unit, disposed above an air cavity, comprising:
   a first electrode,
   a second electrode, and
   a piezoelectric layer;
   a plurality of compensation layers comprising respective materials that adjusts a resonance frequency that is modified in the bulk acoustic source resonance unit based on a temperature in a direction opposite to a direction of the modification; and
   a property compensation layer included above the plurality of compensation layers,
   wherein the first electrode is disposed above the piezoelectric layer and the second electrode is disposed below the piezoelectric layer, and
   wherein the plurality of compensation layers comprises:
   a first compensation layer disposed above the first electrode;
   a second compensation layer disposed below the second electrode; and
   a third compensation layer disposed below the second electrode, and
   wherein the property compensation layer is included above the edges of a surface of the first compensation layer so that a remaining portion of the surface between the edges is not covered by the property compensation layer.

28. The BAWR of claim 27, wherein the first compensation layer, the second compensation layer and the third compensation layer comprise a silicon oxide-based material.

29. The BAWR of claim 27, wherein the first compensation layer, the second compensation layer and the third compensation layer comprise silicon oxide doped with an impurity.

30. The BAWR of claim 29, wherein the impurity comprises at least one element selected from the group consisting of arsenic (As), antimony (Sb), phosphorus (P), boron (B), germanium (Ge), silicon (Si), and aluminum (Al).

* * * * *